(12) United States Patent
Takashima

(10) Patent No.: US 8,064,240 B2
(45) Date of Patent: Nov. 22, 2011

(54) SEMICONDUCTOR MEMORY DEVICE

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 12/502,929

(22) Filed: Jul. 14, 2009

(65) Prior Publication Data
US 2010/0014341 A1   Jan. 21, 2010

(30) Foreign Application Priority Data

Jul. 15, 2008 (JP) ................................ 2008-183666

(51) Int. Cl.
*G11C 11/22* (2006.01)
*G11C 11/24* (2006.01)

(52) U.S. Cl. ....... 365/145; 365/49.13; 365/65; 365/117; 365/149

(58) Field of Classification Search .................. 365/145, 365/49.13, 65, 230.03, 117, 129
See application file for complete search history.

(56) References Cited

U.S. PATENT DOCUMENTS

| | | | |
|---|---|---|---|
| 5,903,492 A | 5/1999 | Takashima | |
| 6,473,331 B1 * | 10/2002 | Takashima | 365/145 |
| 6,492,221 B1 * | 12/2002 | Hofmann et al. | 438/238 |
| 6,493,251 B2 * | 12/2002 | Hoya et al. | 365/145 |
| 6,807,085 B2 * | 10/2004 | Takashima | 365/145 |
| 6,930,908 B2 * | 8/2005 | Hoya et al. | 365/145 |
| 7,091,537 B2 * | 8/2006 | Ozaki | 257/295 |
| 7,298,657 B2 * | 11/2007 | Domae et al. | 365/200 |
| 2006/0113581 A1 * | 6/2006 | Miki et al. | 257/306 |
| 2007/0008765 A1 * | 1/2007 | Takashima | 365/145 |
| 2008/0186754 A1 * | 8/2008 | Shiratake | 365/145 |
| 2010/0118586 A1 * | 5/2010 | Shiratake | 365/145 |

FOREIGN PATENT DOCUMENTS

| | | |
|---|---|---|
| JP | H11-177036 A | 7/1999 |
| JP | 2000-022010 A | 1/2000 |
| JP | 2007-018600 A | 1/2007 |

* cited by examiner

*Primary Examiner* — VanThu Nguyen
*Assistant Examiner* — Khamdan Alrobaie
(74) *Attorney, Agent, or Firm* — Knobbe, Martens & Olson & Bear LLP

(57) ABSTRACT

A memory includes word lines; plate lines; first to eighth bit lines; cell transistors; ferroelectric capacitor connected in parallel with cell transistors; sense amplifiers, wherein cell transistors and ferroelectric capacitors configure cells, the cells are connected in series to configure first to eighth cell blocks, the cell blocks are connected to the same word lines, first ends of the cell blocks are respectively connected to the bit lines, second ends of the cell blocks are respectively connected to the different plate lines, one of the first to the fourth bit lines and one of the fifth to the eighth bit lines are configured to be selectively connected to the sense amplifier during an operation, numbers of the cells connected in series between the bit lines and the plate lines are different in the first to the fourth cell blocks, and are different in the fifth to the eighth cell blocks.

10 Claims, 13 Drawing Sheets

MUX

SEMICONDUCTOR MEMORY DEVICE

CROSS-REFERENCE TO RELATED APPLICATION

This application is based upon and claims the benefit of priority from the prior Japanese Patent Applications No. 2008-183666, filed on Jul. 15, 2008, the entire contents of which are incorporated herein by reference.

FIELD OF THE INVENTION

The present invention relates to a semiconductor memory device and, for example, to a nonvolatile ferroelectric memory.

RELATED ART

Recently, a "Series connected TC unit type ferroelectric RAM (hereinafter, also simply called a ferroelectric memory)" which consists of series connected memory cells (unit cells) each having a transistor having a source terminal and a drain terminal and a ferroelectric capacitor in between said two terminals (see Japanese Patent Applications Laid-open Nos. 2000-22010, H11-177036, and H10-255483).

This ferroelectric memory includes a memory cell block having the plural memory cells connected in series. One end of the memory cell block is connected to a bit line via a block selection transistor and the other end of the memory cell block is connected to a plate.

Japanese Patent Application Laid-open No. 2007-18600 (hereinafter, Patent Document 1) discloses a ferroelectric memory having one block group connected to one sense amplifier circuit, the block group being configured by four memory cell blocks. For example, first to fourth memory cell blocks constituting a block group are provided corresponding to bit lines of four columns, respectively. Sense amplifiers are provided corresponding to the bit lines of these four columns. The ferroelectric memory described in Patent Document 1 can achieve a suppression of noise between the bit lines and can decrease the sense amplifier circuits.

However, according to the ferroelectric memory described in Patent Document 1, a plate line needs to be provided corresponding to each of the first to fourth memory cell blocks. Conventionally, a connection unit is provided between a plate line and a memory cell block to connect respective wiring of four plate lines to the first to fourth memory cell blocks. This connection unit is formed in the same wiring layer as that of wiring of a bit line. The bit line is connected to circumvent this connection unit (see paragraph [0052] and FIG. 11 in Patent Document 1).

Because the wiring of the bit line needs to circumvent the connection unit, an interval between bit lines adjacent in a row direction (an interval between the memory cell blocks) needs to be increased to some extent. This has been interference to downscaling of memory cells.

To avoid the circumvention of the bit lines, the wiring of the bit lines can be formed in a wiring layer separate from that of the connection unit. However, in this case, manufacturing cost increases due to an increase in the number of laminated layers of the wiring.

SUMMARY OF THE INVENTION

A semiconductor memory device according to an embodiment of the present invention comprises: a plurality of word lines; a plurality of plate lines; first to eighth bit lines; a plurality of cell transistors comprising gate electrodes connected to the word lines; a plurality of ferroelectric capacitors, each of which is connected in parallel with one of the cell transistors between a source and a drain of the one of the cell transistors; and a sense amplifier configured to detect data in one of the ferroelectric capacitors, wherein one of the cell transistors and one of the ferroelectric capacitors configure a memory cell, a plurality of the memory cells are connected in series in order to configure first to eighth memory cell blocks, the first to the eighth memory cell blocks are connected to the same word lines, first ends of the first to the eighth memory cell blocks are respectively connected to the first to the eighth bit lines via block selection transistors, second ends of the first to the eighth memory cell blocks are respectively connected to the different plate lines, one of the first to the fourth bit lines and one of the fifth to the eighth bit lines are configured to be selectively connected to the sense amplifier during an operation, and numbers of the memory cells connected in series between the bit lines and the plate lines are different in the first to the fourth memory cell blocks, and are different in the fifth to the eighth memory cell blocks.

A semiconductor memory device according to an embodiment of the present invention comprises: a plurality of word lines; a plurality of plate lines; a plurality of bit lines; a plurality of cell transistors comprising gate electrodes connected to the word lines; and a plurality of ferroelectric capacitors, each of which is connected in parallel with one of the cell transistors between a source and a drain of the one of the cell transistors, wherein the cell transistor and the ferroelectric capacitor configure a memory cell, a plurality of the memory cells are connected in series in order to configure a plurality of memory cell blocks, the memory cell blocks are connected to the same word lines, first ends of the memory cell blocks are respectively connected to the bit lines via a block selection transistors, and second ends of the memory cell blocks are respectively connected to the plate lines, and numbers of the memory cells connected in series between the bit lines and the plate lines in the memory cell blocks are two or more different values.

A semiconductor memory device according to an embodiment of the present invention comprises: a plurality of word lines; a plurality of plate lines; a plurality of bit lines; a plurality of cell transistors comprising gate electrodes connected to the word lines; a plurality of ferroelectric capacitors, each of which is connected in parallel with one of the cell transistors between a source and a drain of the one of the cell transistors; and a sense amplifier configured to detect data in one of the ferroelectric capacitors, wherein one of the cell transistors and one of the ferroelectric capacitors configure a memory cell, a plurality of the memory cells are connected in series in order to configure a plurality of memory cell blocks, the memory cell blocks are connected to the same word lines, first ends of the memory cell blocks are respectively connected to the bit lines via block selection transistors, second ends of the memory cell blocks are respectively connected to the plate lines, and connection positions between the memory cell blocks and the plate lines in an extension direction of the bit lines are two or more different positions.

DETAILED DESCRIPTION OF THE INVENTION

Embodiments of the present invention will be explained below with reference to the accompanying drawings. These embodiments do not limit the present invention.

First Embodiment

Figure 1:
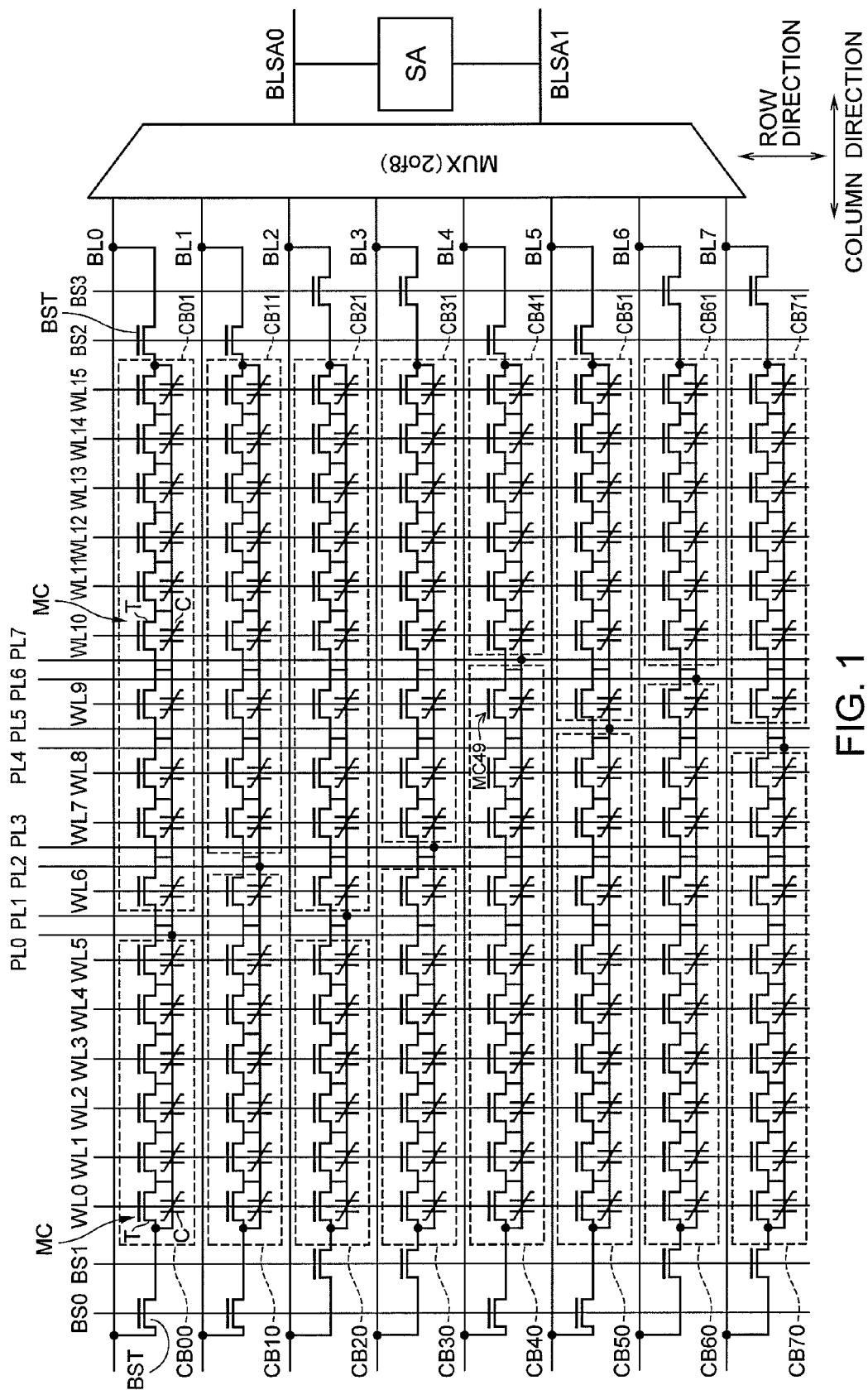
FIG. 1 is a circuit diagram showing a configuration of a ferroelectric memory according to a first embodiment of the present invention.

FIG. 1 is a circuit diagram showing a configuration of a ferroelectric memory according to a first embodiment of the present invention. The ferroelectric memory according to the first embodiment is the above-described "series connected TC unit type ferroelectric RAM".

This ferroelectric memory includes 16 word lines WL0 to WL15 (hereinafter, also called WLi), eight bit lines BL0 to BL7 (hereinafter, also called BLi), and eight plate lines PL0 to PL7 (hereinafter, also called PLi). Note that "i" is an integer.

The word lines WLi are extended in a row direction. The plate lines PLi are arranged substantially in parallel with an extension direction of the word lines. The bit lines BLi are extended in a column direction substantially orthogonal to the row direction.

Memory cells MC are provided corresponding to intersections between the bit lines BLi and the word lines WLi. Each memory cell MC includes one cell transistor TC and one ferroelectric capacitor C. The ferroelectric capacitor C has a configuration having a ferroelectric film sandwiched between two electrodes.

The ferroelectric capacitor C is connected in parallel with the cell transistor T between a source and a drain of the cell transistor T. With this arrangement, the cell transistor T and the ferroelectric capacitor C constitute a memory cell MC. An electrode of the cell transistor T is connected to any one of the word lines WLi.

Memory cell blocks CB00 to CB71 (hereinafter, also simply "CB") each include a plurality of the memory cells MC connected in series. One ends of the memory cell blocks CBi0 are connected to different bit lines BLi via a block selection transistor BST, respectively. The other ends of the memory cell blocks CBi0 are connected to different plate lines PLi, respectively. One ends of the memory cell blocks CBi1 are connected to different bit lines BLi via the block selection transistor BST, respectively. The other ends of the memory cell blocks CBi1 are connected to different plate lines PLi, respectively. The memory cell blocks CBi0 and CBi1 are connected in common to the same bit line BLi, and are also connected in common to the same plate line PLi.

The block selection transistor BST is controlled by block selection signals BS0 to BS3. The memory cell blocks CB00, CB10, CB40, and CB50 connected to the block selection transistor BST driven by the same block selection signal BS0 include different numbers (6, 7, 10, 9) of the memory cells MC, respectively. Similarly, the memory cell blocks CB20, CB30, CB60, and CB70 connected to the block selection transistor BST driven by the same block selection signal BS1 include different numbers (6, 7, 10, 9) of the memory cells MC, respectively. That is, the number of the memory cells MC simultaneously connected in series between bit lines and plate lines by the same block selection signal is different for each column (for each bit line). This relationship is similar in the memory cell blocks CBi1.

When the bit selection line BS0 is activated, for example, the numbers of the memory cells MC connected in series between BL0 and PL0, between BL1 and PL2, between BL4 and PL7, and between BL5 and PL5 are different from each other and 6, 7, 10, 9 in the first to fourth memory cell blocks CB00, CB10, CB40, and CB50, respectively. Similarly, when the bit selection line BS1 is activated, the numbers of the memory cells MC connected in series between BL2 and PL1, between BL3 and PL3, between BL6 and PL6, and between BL7 and PL4 are different from each other and 6, 7, 10, 9 in the fifth to eighth memory cell blocks CB20, CB30, CB60, and CB70, respectively.

As explained above, when the number of the memory cells MC simultaneously connected in series between the bit line and the plate line is changed for each column, the connection position of the plate line PLi and the memory cell block CBi can be differentiated in the column direction. Accordingly, as described later, even when the number of the plate lines is large, a distance between the plate line and each memory cell block can be shortened. Consequently, a design of wiring between the plate lines and the memory cell blocks and wiring of the bit lines can be facilitated.

Total numbers of the memory cells MC included in two memory cell blocks CBi0 and CBi1 sharing the bit lines BLi and the plate lines PLi are equal to each other. For example, a total number of the memory cells MC included in two memory cell blocks CB00 and CB01 sharing the bit line BL0 and the plate line PL0 is 16. A total number of the memory cells MC included in two memory cell blocks CB10 and CB11 sharing the bit line BL1 and the plate line PL2 is also 16. That is, a total number of the memory cells sharing the bit line and the plate line is fixed. Accordingly, a size of a cell block is constant in every two memory cell blocks sharing the bit line and the plate line. Consequently, both ends of the memory cell blocks sharing the bit line and the plate line are aligned in the row direction, and therefore the block selection transistors can be aligned in the row direction. Further, the block selection lines BSi can be linearly laid out.

A multiplexer MUX is provided between the bit lines BLi and a sense amplifier SA. In a data read operation, the multiplexer MUX selectively connects one of the first to fourth bit lines BL0, BL1. BL4, and BL5 to the sense amplifier SA, and selectively connects one of the fifth to eighth bit lines BL2, BL3, BL6, and BL7 to the sense amplifier SA.

The sense amplifier SA obtains reference data from one of two bit lines connected by the multiplexer MUX, and obtains information data stored in the memory cell MC from the other of the two bit lines. The sense amplifier SA detects a logic value of the information data based on the reference data.

In the first embodiment, the number of the plate lines connected to one multiplexer MUX is eight. However, the number of the plate lines can be another value. For example, the number of the plate lines connected to one multiplexer MUX can be 4, 8, 16, 32, . . . . With this arrangement, the number of the sense amplifiers and the number of the bit lines simultaneously activated can be decreased to ½, ¼, ⅛, 1/16, . . . of numbers when the sense amplifier SA is arranged for each bit line pair. That is, when the number of the plate lines connected to one multiplexer MUX is increased, an area of the sense amplifiers and power consumption can be decreased.

According to the first embodiment, the multiplexer MUX selectively connects two of the eight bit lines BLi to the sense amplifier SA. Therefore, the number of the sense amplifiers can be ½ of that in a conventional technique of FIG. 3 in JP-A 2007-18600(KOKAI). Because only the two of the eight bit lines BLi are driven, power consumption decreases more than that of the conventional technique.

In the first embodiment, the connection point between the plate line PLi and the cell block CB is changed to a different position for each column. That is, the connection points between the plate lines PLi and the cell blocks CB in adjacent two columns are located between different memory cells MC. Accordingly, a memory cell size can be decreased without changing a wiring pitch of the plate lines PLi.

Figure 2:
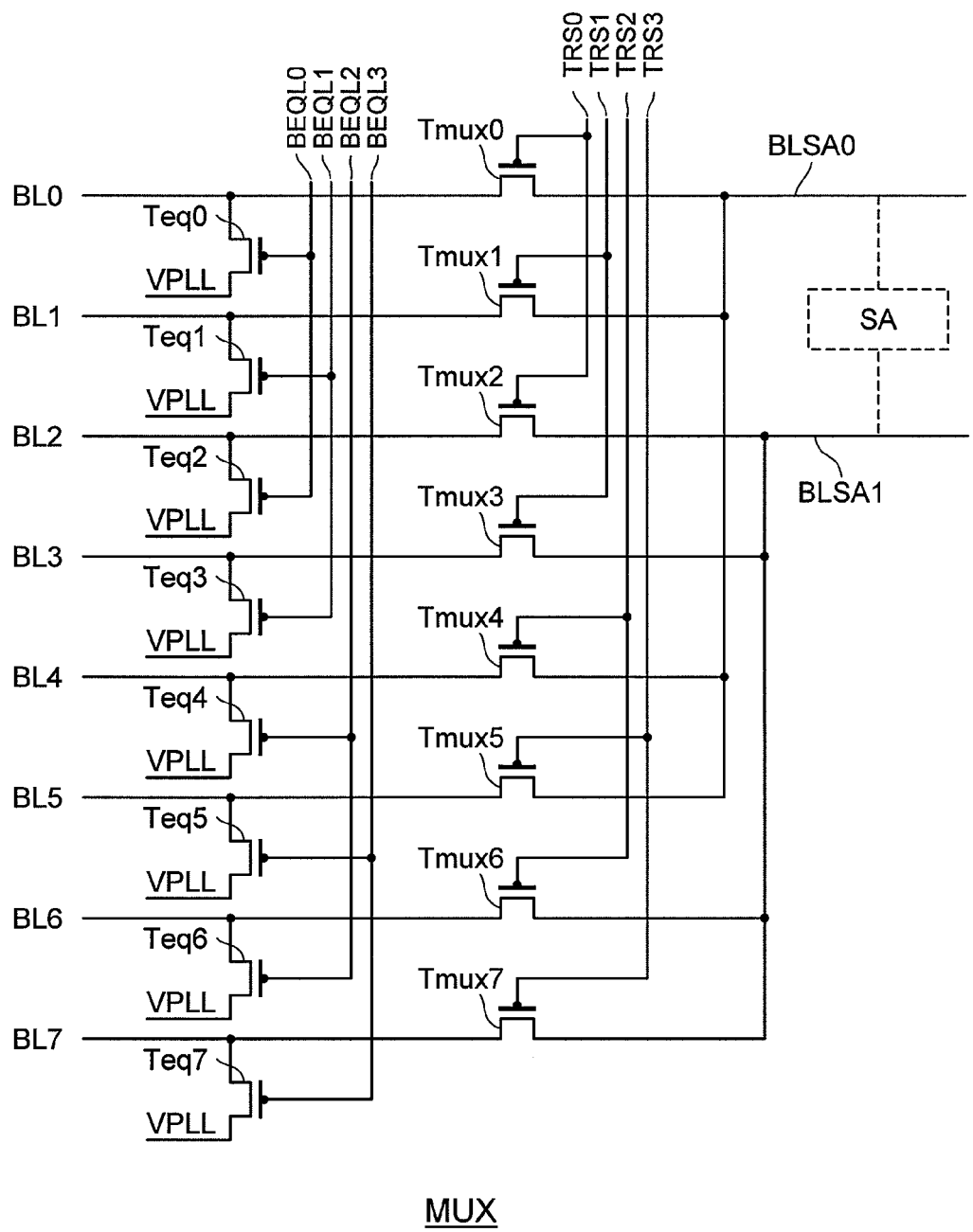
FIG. 2 is a circuit diagram showing an internal configuration of the multiplexer MUX.

FIG. 2 is a circuit diagram showing an internal configuration of the multiplexer MUX. The multiplexer MUX includes MUX transistors Tmuxi. The MUX transistors Tmux0, Tmux1, Tmux4, and Tmux5 are connected between the first to fourth bit lines BL0, BL1, BL4, and BL5 and a sense node BLSA0, respectively. The MUX transistors Tmux2, Tmux3, Tmux6, and Tmux7 are connected between the fifth to eighth bit lines BL2, BL3, BL6, and BL7 and a sense node BLSA1, respectively.

When any one of transfer signals TRS0 to TRS3 is raised to logic high and also when other transfer signals are maintained logic low, the multiplexer MUX connects one of the first to fourth bit lines BL0, BL1, BL4, and BL5 to the sense node BLSA0, and connects one of the fifth to eighth bit lines BL2, BL3, BL6, and BL7 to the sense node BLSA1.

For example, when the transfer signal TRS2 is raised to logic high, the bit lines BL4 and BL6 are selectively connected to the sense nodes BLSA0 and BLSA1, respectively. In this case, when the block selection signal BS0 is activated to logic high, the bit line BL4 transmits the information data within the memory cell MC to the sense node BLSA0, and the bit line BL6 transmits the reference data to the sense node BLSA1.

Equalizing transistors Teqi are connected between a predetermined potential VPLL and the bit lines BLi. The equalizing transistors Teqi are controlled by equalization signals BEQL0 to BEQL3.

The equalization signals BEQL0 to BEQL3 inactivate only an equalizing transistor connected to a selected bit line, and maintain equalizing transistors connected to unselected bit lines activated.

For example, when the transfer signal TRS2 is activated to logic high, the equalization signal BEQL2 is inactivated to logic low. Accordingly, equalizing transistors Teq4 and Teq6 connected to selected bit lines BL4 and BL6 become off states. Consequently, the selected bit lines BL4 and BL6 become floating, and can transmit either the information data or the reference data.

On the other hand, the equalization signals BEQL0, BEQL1, and BEQL3 remain logic high. Therefore, the unselected bit lines BL0 to BL3, BL5, and BL7 are fixed to the potential VPLL. Accordingly, the unselected bit lines BL0 to BL3, BL5, and BL7 function as shield lines for the selected bit lines BL4 and BL6.

The activation means turning on or driving of an element or a circuit, and the inactivation means turning off or suspension of an element or a circuit. Therefore, a HIGH (high potential level) signal can be an activation signal, or a LOW (low potential level) signal can be an activation signal. For example, an NMOS transistor is activated by setting a gate to HIGH. On the other hand, a PMOS transistor is activated by setting a gate to LOW.

Figure 3:
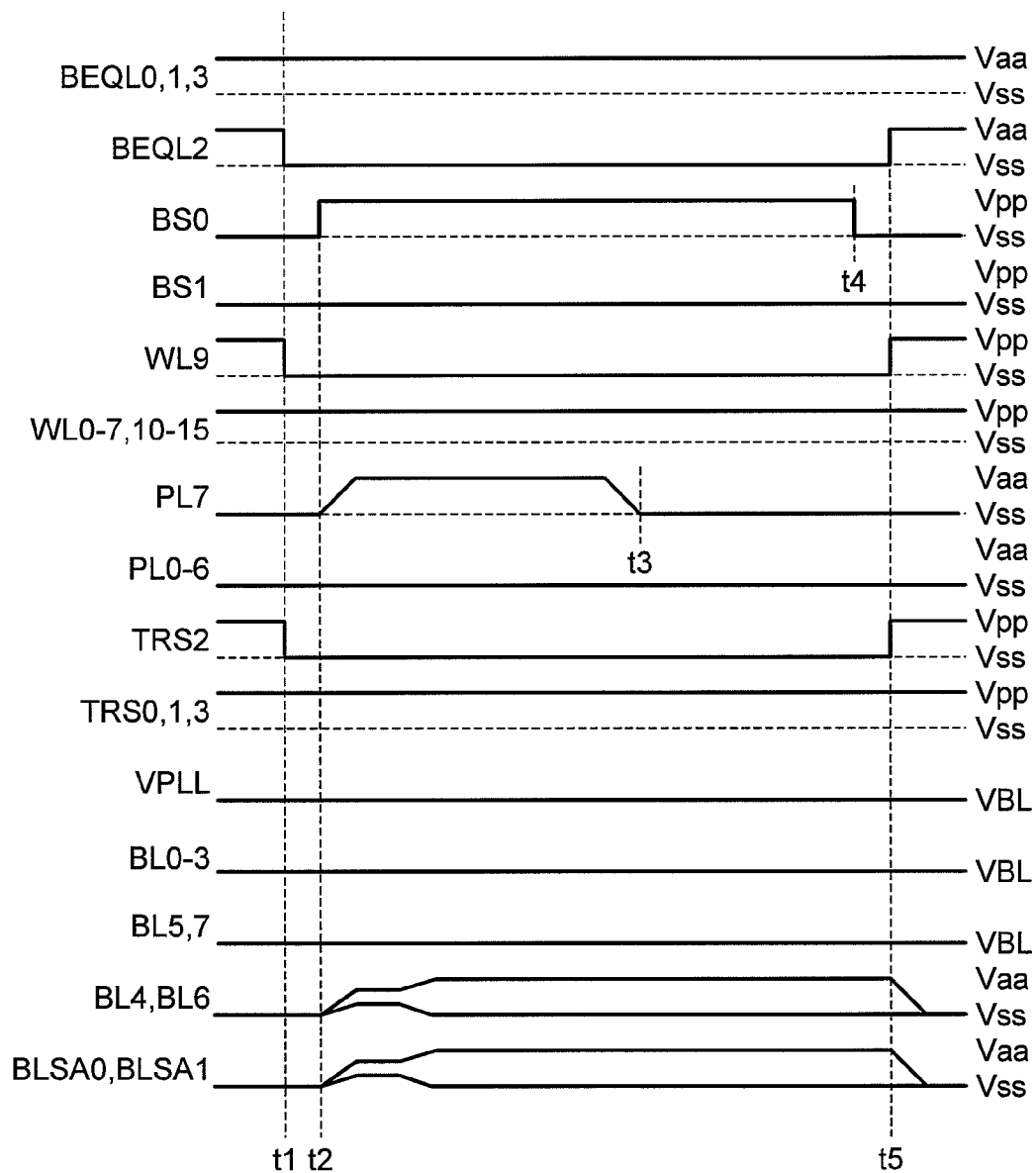
FIG. 3 is a timing diagram showing a data read operation of the ferroelectric memory according to the first embodiment.

FIG. 3 is a timing diagram showing a data read operation of the ferroelectric memory according to the first embodiment. At t1, the transfer signal TRS2 is activated, and the equalization signal BEQL2 is inactivated. Further, the word line WL9 is fallen down to logic low. At t2, the block selection signal BS0 and the plate line PL7 are activated.

At this time, among the memory cells MC included in the memory cell block CB40 in FIG. 1, only the cell transistor T of a memory cell MC49 is in the off state, and cell transistors of other memory cells maintain the on states. Accordingly, the ferroelectric capacitor C of the memory cell MC49 is connected between the bit line BL4 and the plate line PL7. The plate line PL7 is activated at a high level potential in this state. Therefore, the information data stored in the memory cell MC49 shown in FIG. 1 is transmitted to the bit line BL4.

The reference data is transmitted to the bit line BL6. The bit line BL6 is connected to the sense node BLSA1; however, the memory cell block CB60 is not connected to the bit line BL6 because the block selection signal BS1 is in the inactive state. Accordingly, the bit line BL6 can transmit the reference data. While a generating circuit of the reference data is not shown, a publicly known technique can be used.

Because the unselected bit lines BL0 to BL3, BL5, and BL7 are precharged to the potential VPLL, both sides of the selected bit lines BL4 and BL6 can be sandwiched by shield bit lines. Accordingly, noise between the selected bit lines BL4 and BL6 can be cancelled.

At t3, the plate line PL7 is returned to the low level potential, and the information data is written back to the memory cell MC49. This is because the ferroelectric memory is a destructive-read memory. At t5, the read operation is finished.

Figure 4:
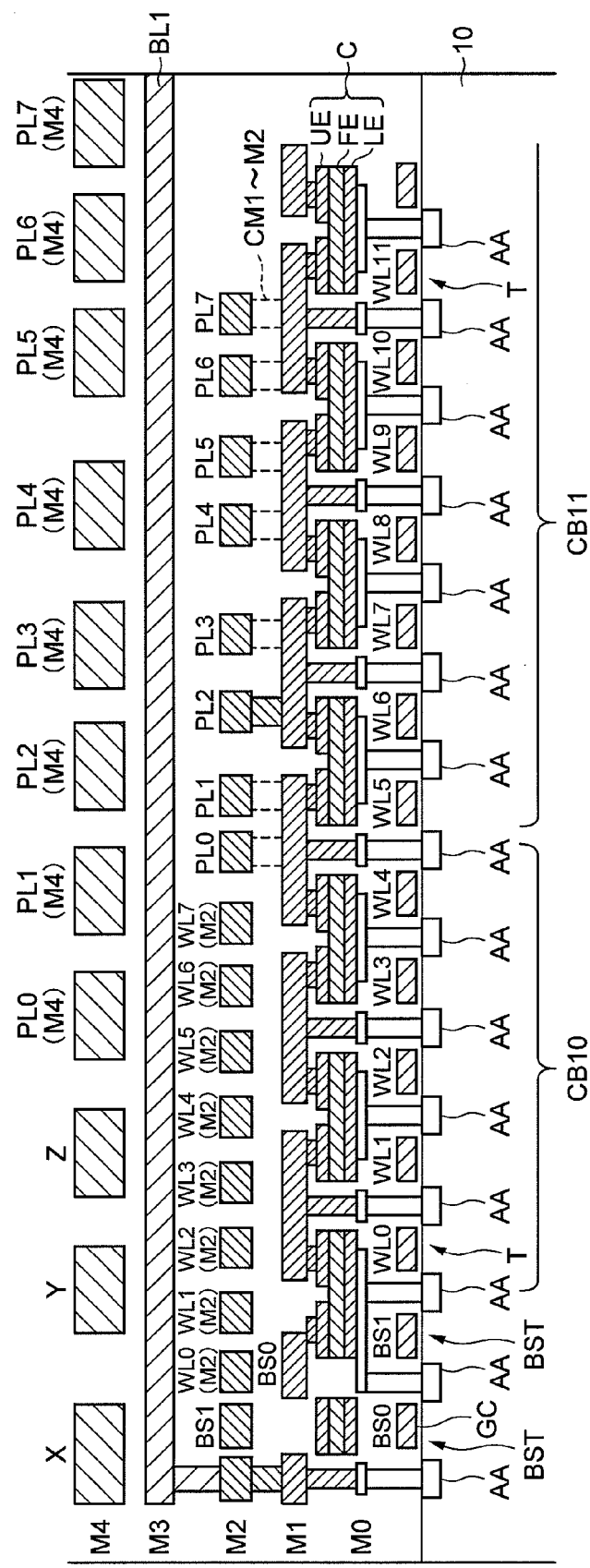
FIG. 4 is a cross-sectional view of the memory cell blocks CB10 and CB11 along the bit line BL1.

FIG. 4 is a cross-sectional view of the memory cell blocks CB10 and CB11 along the bit line BL1. The word line WLi includes a function of the word line and a function as a gate electrode of the cell transistor T.

The cell transistor T is formed on a silicon substrate 10. Reference character AA denotes a source or drain diffusion layer. The ferroelectric capacitor C is formed above the cell transistor T. The ferroelectric capacitor C is formed by laminating a lower electrode LE, a ferroelectric film FE, and an upper electrode UE. The memory cells MC adjacent in the column direction share a source or a drain of the cell transistor T, and also share the lower electrode LE or the upper electrode UE of the ferroelectric capacitor C.

Wiring within the memory cell block CB is formed by a zeroth metal layer M0 or a first metal layer M1.

The plate lines PLi are formed in a second metal layer M2. The second metal layer M2 can be used also as shunt lines WLi (M2) of the cell transistor T.

The plate lines PLi are directly connected to the first metal layer M1 as wiring within the memory cell block CB via only a first contact cM1-M2 with no wiring layer interposed therebetween. In the cross-sectional view shown in FIG. 4, the plate line PL2 is connected to a diffusion layer located between the word lines WL6 and WL7 via the first metal layer M1. Contacts between other plate lines PL0, PL1, PL3 to PL7 and the first metal layer M1 are not shown in the cross-sectional view of FIG. 4, but are formed at positions shown by broken lines.

A pattern of the first metal layer M1 (connection wiring of the upper electrode UE) is formed being deviated in the column direction by only one memory cell for each column. Therefore, the plate lines PL0 and PL1 are connected to the diffusion layer AA between the word lines WL5 and WL6.

Figure 7:
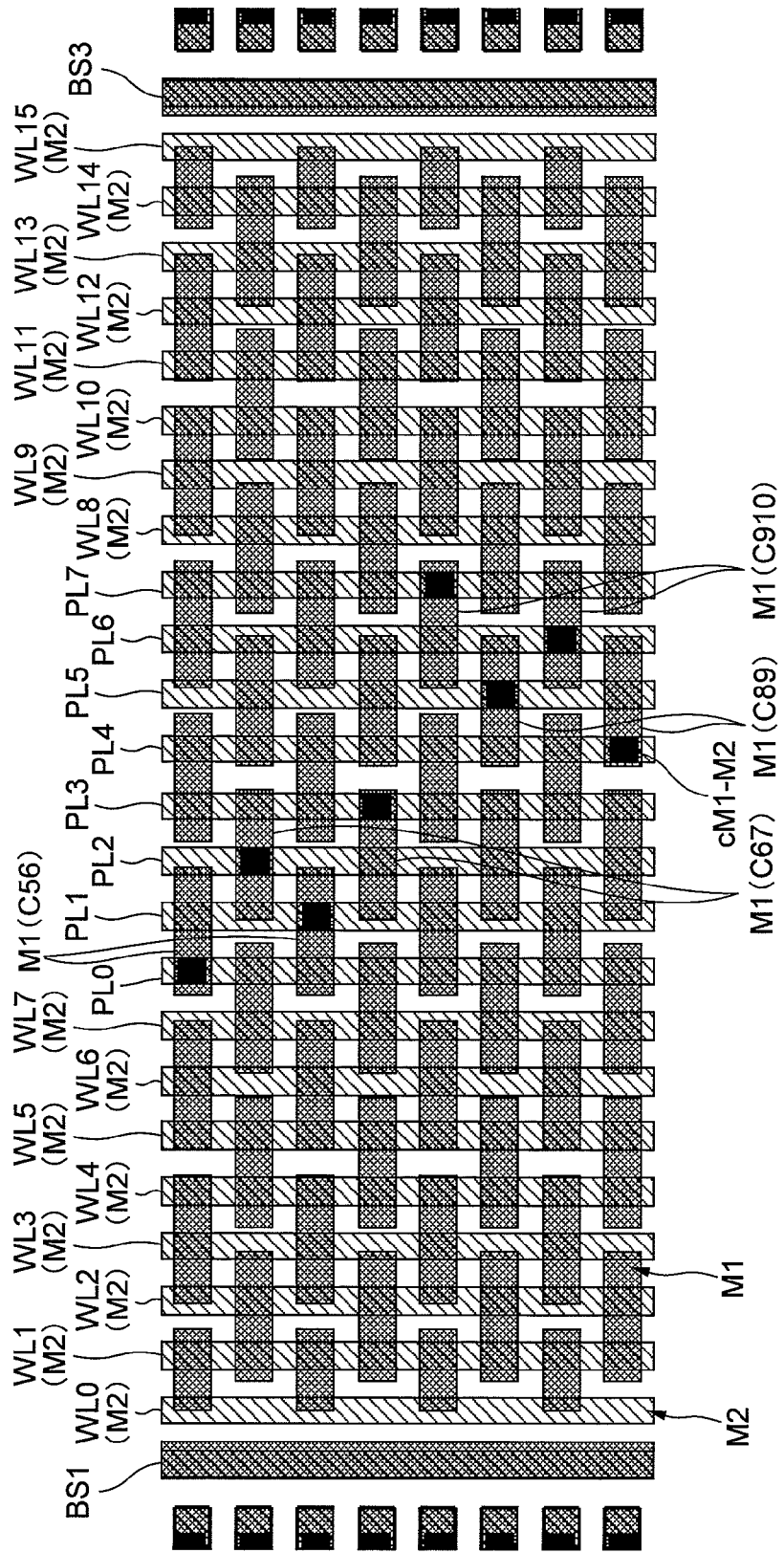

The plate lines PL6 and PL7 are connected between the word lines WL9 and WL10 (see FIG. 7).

In the first embodiment, connection points between the plate lines PLi and the memory cell blocks CBi0 and CBi1 are located between different memory cells MC in adjacent columns. Therefore, the plate lines PLi do not require a connection unit of M2 shown in paragraph [0052] and FIG. 11 of Japanese Patent Application Laid-open No. 2007-18600, and are directly connected to the first metal layer M1. Accordingly, even when eight or more plate lines PLi are provided, these plate lines can be arranged in the column direction. In this case, the plate line PL1 can be linearly formed or can be curved.

A third metal layer M3 is used as wiring of the bit lines BLi. Further, a fourth metal layer M4 is used as shunt lines PLi (M4) of the plate lines PLi. The shunt lines PLi (M4) are provided for decreased resistance in wiring and for high migration. Therefore, practical wiring is configured by the metal layers M0 to M3. That is, the number of metal layers in the first embodiment is not different from that of the device disclosed in Japanese Patent Application Laid-open No. 2007-18600.

FIGS. 5 to 8 are layout diagrams of the ferroelectric memory according to the first embodiment. FIGS. 5 to 8 each show a layout of several layers.

Figure 5:
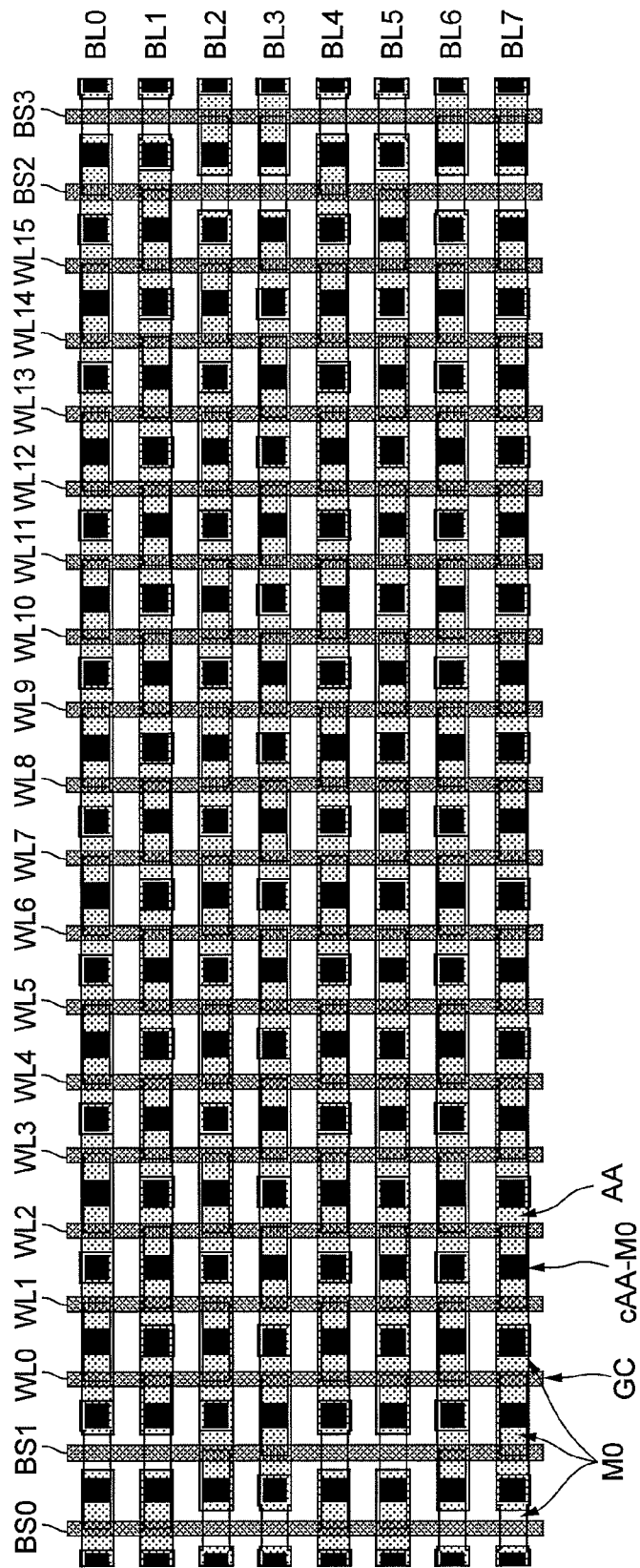
FIGS. 5 to 8 are layout diagrams of the ferroelectric memory according to the first embodiment.

FIG. 5 shows the diffusion layer AA, a gate electrode (word line) layer GC, the zeroth metal layer M0, and a contact plug cAA-M0 between the metal layer M0 and the diffusion layer AA.

Figure 6:
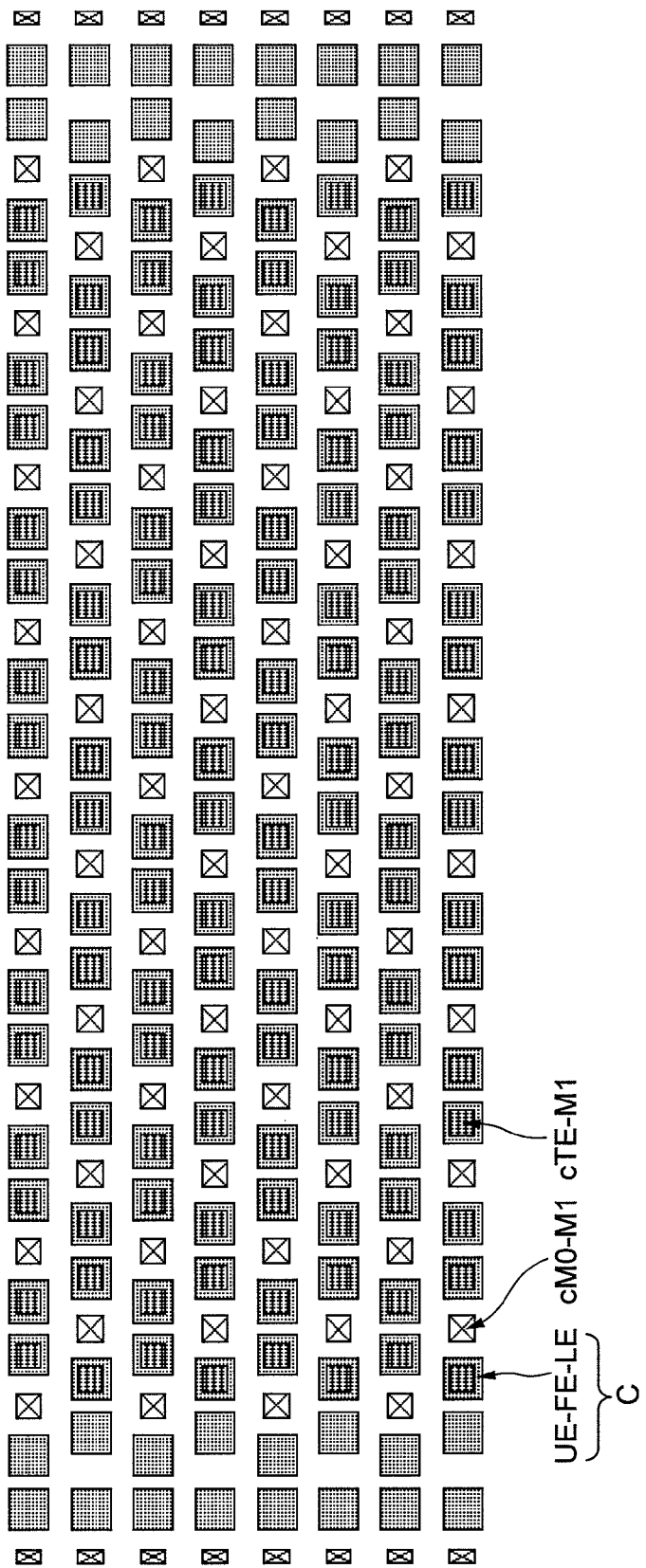

FIG. 6 shows the ferroelectric capacitor C including the upper electrode UE, the lower electrode LE, and the ferroelectric film FE. A contact cM0-M1 shows a contact plug between the metal layers M0 and M1. The contact cM0-M1 is connected to the diffusion layer AA via the contact plug cAA-M0 shown in FIG. 5. A contact cTE-M1 is a contact plug connecting between the upper electrode UE of the ferroelectric capacitor C and the metal layer M1.

FIG. 7 shows a wiring layout of the first metal layer M1 and the second metal layer M2. FIG. 7 also shows the contact cM1-M2 connecting the plate lines PLi and the first metal layer M1. Wiring M1 (C56) formed by the first metal layer M1 connects the upper electrodes UE of the ferroelectric capacitors C of two adjacent memory cells MC corresponding to the word lines WL5 and WL6. Similarly, wiring M1 (Cij) connects the upper electrodes UE of the ferroelectric capacitors C of two adjacent memory cells MC corresponding to the word lines WLi and WLj.

The pattern of the first metal layer M1 is deviated in the column direction only by one memory cell (a half pitch) for each column. As shown in FIG. 7, the plate line is connected to the memory cell block by the contact cM1-M2 deviated in the column direction (the extension direction of the bit line) for each column. Accordingly, as shown in FIG. 1, the numbers of the memory cells in the memory cell blocks are classified into a block group of odd numbers and a block group of even numbers.

Figure 8:
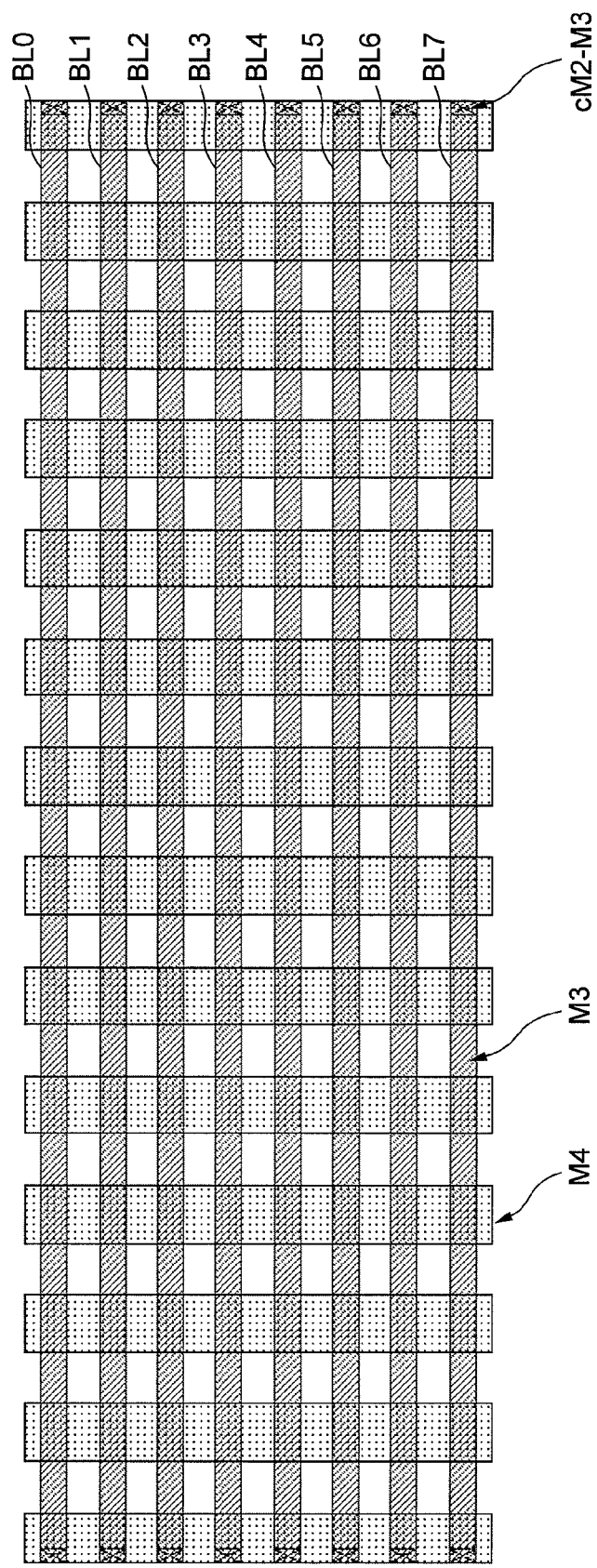

FIG. 8 shows wiring of the third metal layer M3 (the bit lines BLi) and the fourth metal layer M4 (the shunt lines PLi (M4)). A contact cM2-M3 is a contact plug between the second metal layer M2 and the third metal layer M3.

As shown in FIG. 8, the bit lines BLi are formed as linear wiring, and are not required to be circumvented to connect the plate lines PLi. Because the plate lines PLi are directly connected to the first metal layer M1 as the wiring within the memory cell block as shown in FIG. 4, the connection unit of M2 described in Japanese Patent Application Laid-open No. 2007-18600 is not necessary. Because the bit lines BLi are linearly formed, an interval between the bit lines adjacent in the row direction can be smaller than that in the conventional technique. Consequently, the first embodiment is suitable to downscale the memory cells.

As shown in FIG. 7, the positions of the connection points between the memory cell blocks and the plate lines are deviated for each column. Accordingly, plural plate lines and the memory cell blocks can be easily connected. When the number of the plate lines is increased, the memory cells can be downscaled by properly changing the positions of the connection points between the memory cell blocks and the plate lines.

Second Embodiment

Figure 9:
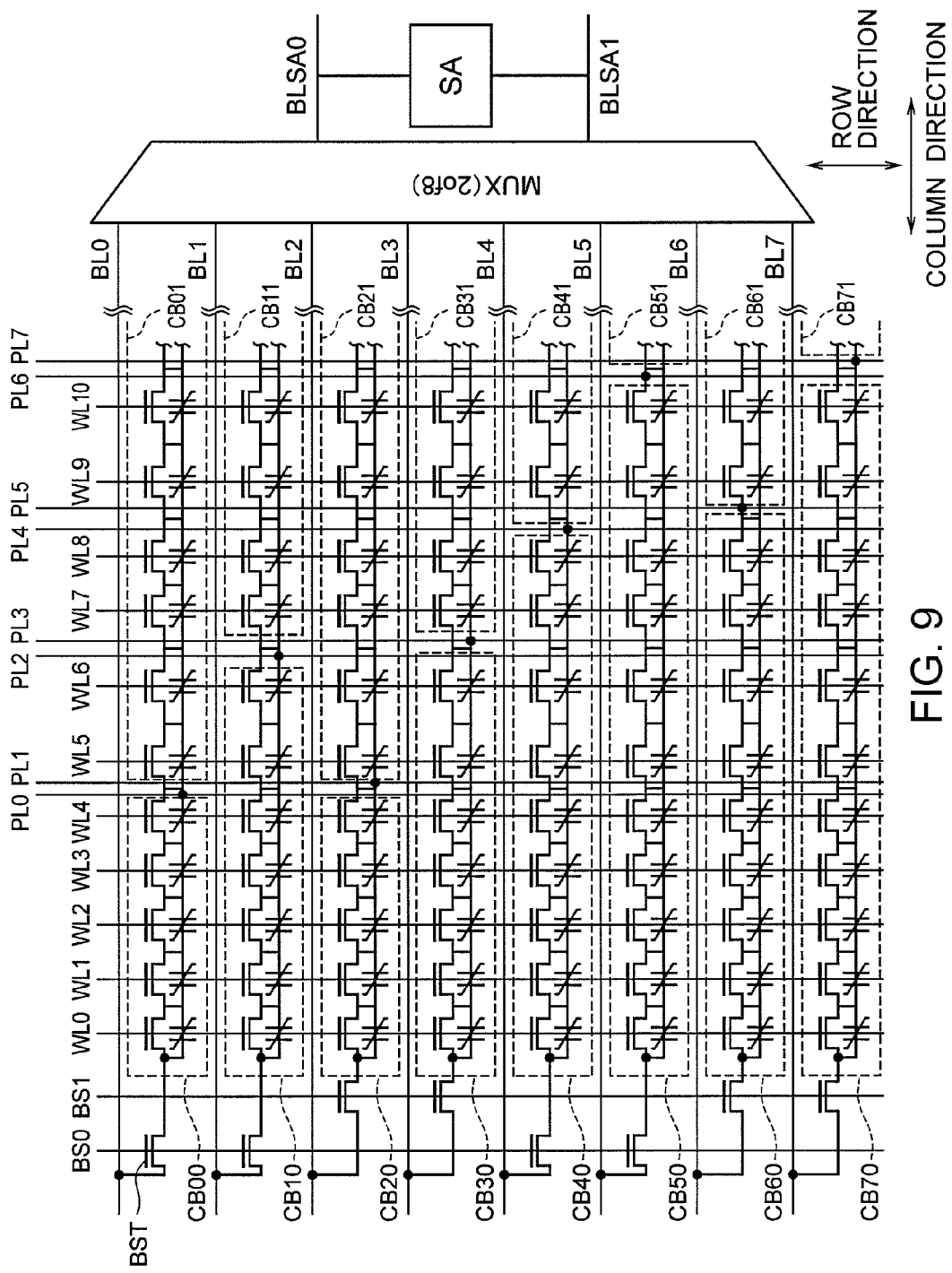
FIG. 9 is a circuit diagram of a ferroelectric memory according to a second embodiment of the present invention.

FIG. 9 is a circuit diagram of a ferroelectric memory according to a second embodiment of the present invention. The second embodiment is different from the first embodiment in that positions of the memory cells are not deviated in adjacent bit lines (see FIG. 11).

In this case, the plate lines PL0 and PL1 are connected to the memory cell blocks between the word lines WL4 and WL5. Therefore, the memory cell blocks CB00 and CB20 are configured by five memory cells MC, respectively, and the memory cell blocks CB01 and CB21 are configured by 11 memory cells MC, respectively.

The plate lines PL6 and PL7 are connected to the memory cell blocks between the word lines WL10 and WL11 (not shown in FIG. 9). Therefore, the memory cell blocks CB50 and CB70 are configured by 11 memory cells MC, respectively, and the memory cell blocks CB51 and CB71 are configured by five memory cells MC, respectively.

Other configuration in the second embodiment including positions of the plate lines PL2 to PL5 can be the same as that in the first embodiment.

Figure 10:
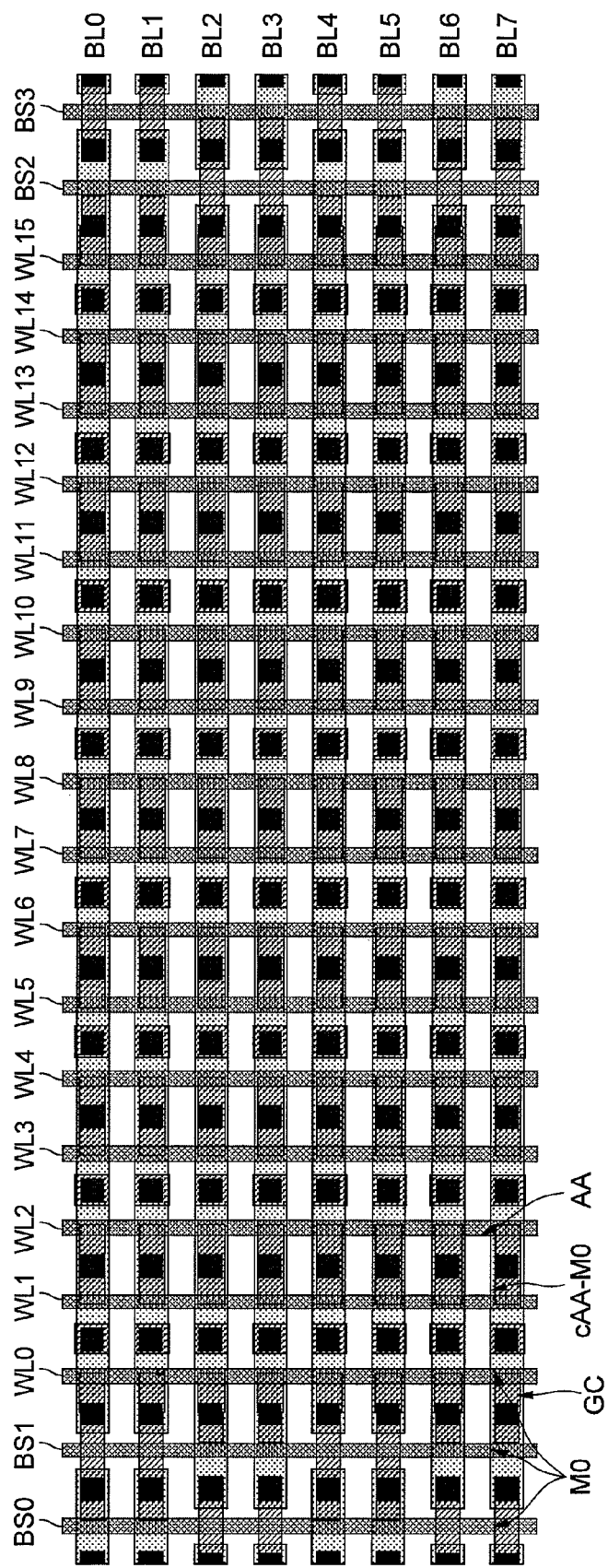
FIGS. 10 to 13 are layout diagrams of the ferroelectric memory according to the second embodiment.
Figure 11:
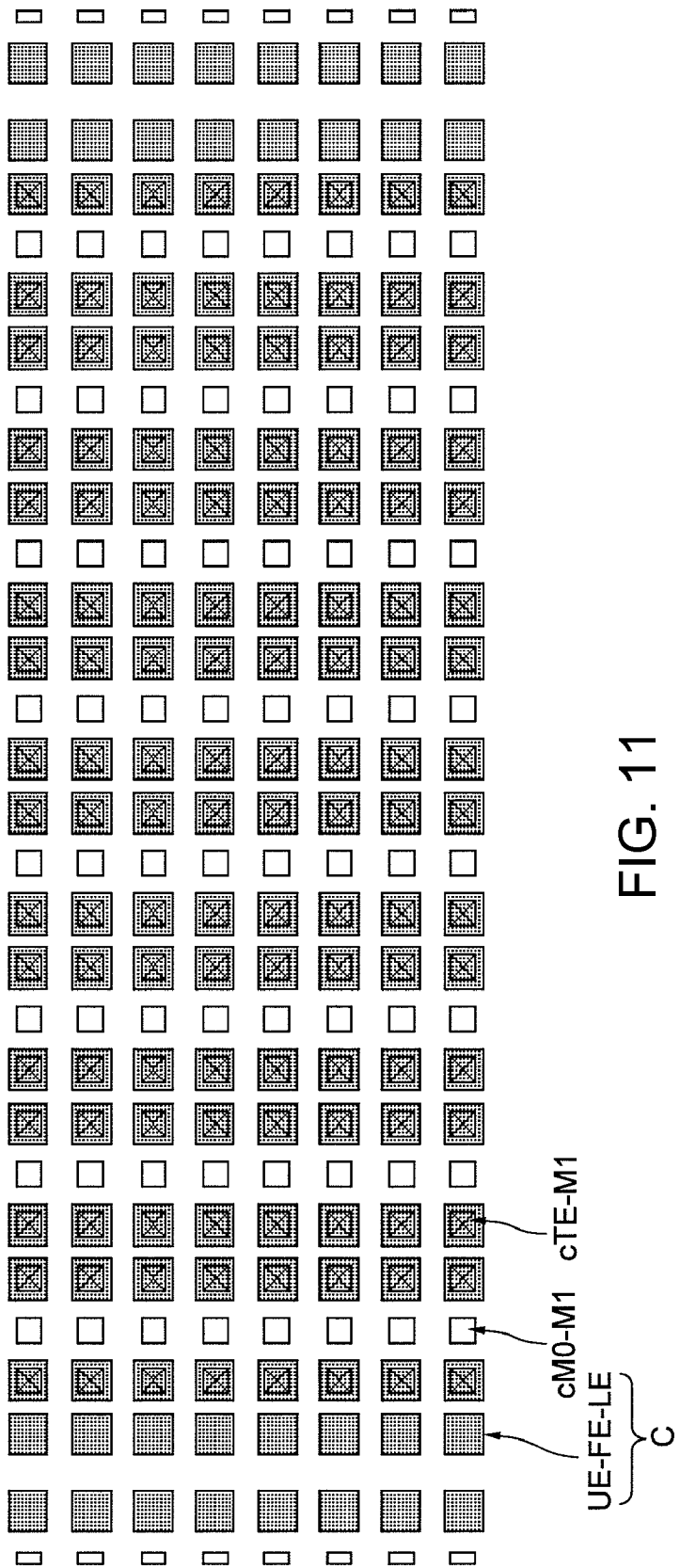
Figure 12:
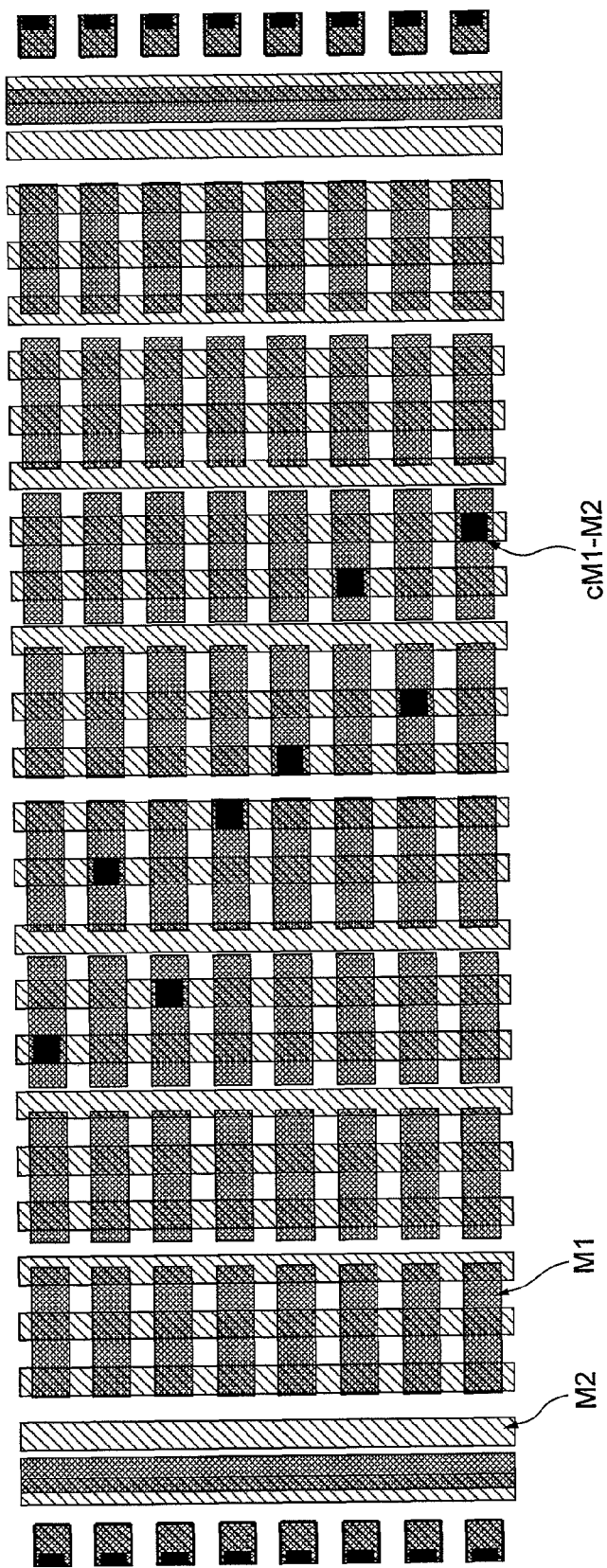
Figure 13:
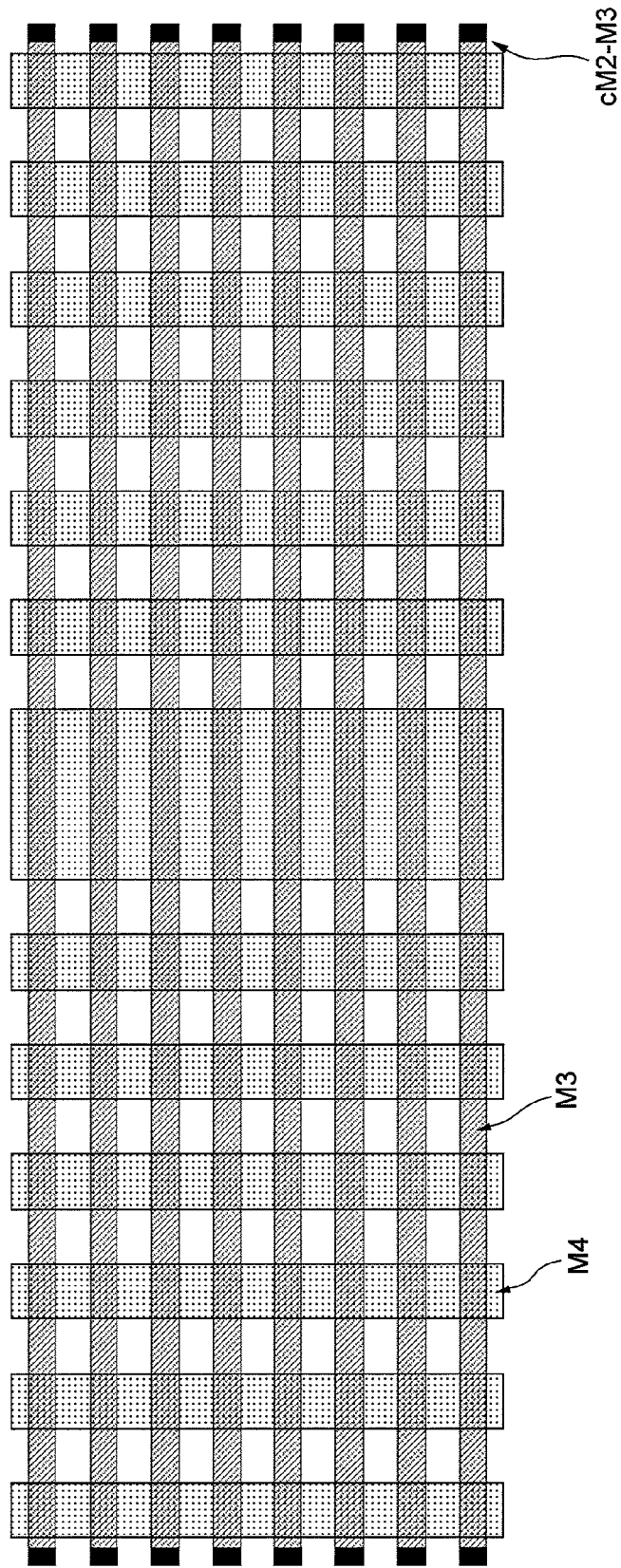

FIGS. 10 to 13 are layout diagrams of the ferroelectric memory according to the second embodiment. FIGS. 10 to 12 each show a layout of several layers.

In the second embodiment, as shown in FIG. 11, memory cells adjacent in the row direction are not deviated in the column direction (the bit line direction). As shown in FIG. 12, positions of M1 connecting the memory cell blocks and the plate lines are aligned in the respective columns.

In the second embodiment, in adjacent columns, connection points between the plate lines PLi and the memory cell blocks CBi0 and CBi1 are shifted to different positions by two memory cells in each column. Therefore, the number of memory cells connected in series in each memory cell block is limited to one of an odd number and an even number. Nevertheless, the second embodiment can achieve the same effect as that in the first embodiment.

The invention claimed is:
1. A semiconductor memory device comprising:
a plurality of word lines;
a plurality of plate lines;
first to eighth bit lines;
a plurality of cell transistors comprising gate electrodes connected to the word lines;
a plurality of ferroelectric capacitors, each of which is connected in parallel with one of the cell transistors between a source and a drain of the one of the cell transistors; and
a sense amplifier configured to detect data in one of the ferroelectric capacitors, wherein
one of the cell transistors and one of the ferroelectric capacitors configure a memory cell, a plurality of the memory cells are connected in series in order to configure first to eighth memory cell blocks, the first to the eighth memory cell blocks each include at least one memory cell connected to the same shared word line, first ends of the first to the eighth memory cell blocks are respectively connected to the first to the eighth bit lines via block selection transistors, second ends of the first to the eighth memory cell blocks are respectively connected to the different plate lines, one of the first to the fourth bit lines and one of the fifth to the eighth bit lines are configured to be selectively connected to the sense amplifier during an operation, and numbers of the memory cells connected in series between the block selection transistors and the plate lines are different in each of the first to the fourth memory cell blocks, and are different in each of the fifth to the eighth memory cell blocks.

2. The device of claim 1, further comprising:

wirings connected upper electrodes of the ferroelectric capacitors to the cell transistors, wherein the plate lines are connected to the cell transistors via the wirings, and the plate lines are immediately above the wirings connecting to the plate lines.

3. The device of claim 2, further comprising:

a plurality of shunt lines respectively connected to the word lines, wherein the shunt lines are configured in the same layer as the layer of the plate lines.

4. The device of claim 2, wherein each plate line is directly connected to one of the wirings via a contact.

5. The device of claim 3, wherein each plate line is directly connected to one of the wirings via a contact.

6. The device of claim 2, wherein the wirings are configured to be deviated in an extension direction of the bit lines by one memory cell for each column of the bit lines, and contacts between the plate lines and the wirings are configured to be deviated in the extension direction of the bit lines for each column of the bit lines.

7. The device of claim 2, wherein the wirings are configured not to be deviated in an extension direction of each column of the bit lines, and contacts between the plate lines and the wirings are configured to be deviated in the extension direction of the bit lines by two of the memory cells for each column of the bit lines.

8. A semiconductor memory device comprising:

a plurality of word lines;

a plurality of plate lines;

a plurality of bit lines;

a plurality of cell transistors comprising gate electrodes connected to the word lines; and a plurality of ferroelectric capacitors, each of which is connected in parallel with one of the cell transistors between a source and a drain of the one of the cell transistors, wherein the cell transistor and the ferroelectric capacitor configure a memory cell, a plurality of the memory cells are connected in series in order to configure a plurality of memory cell blocks, the memory cell blocks respectively include the memory cells connected to the same word lines, first ends of the memory cell blocks are respectively connected to the bit lines via block selection transistors, and second ends of the memory cell blocks are respectively connected to the plate lines, and numbers of the memory cells connected in series between the block selection transistors and the plate lines in the memory cell blocks are four or more different value.

9. A semiconductor memory device comprising:

a plurality of word lines;

a plurality of plate lines;

a plurality of bit lines;

a plurality of cell transistors comprising gate electrodes connected to the word lines;

a plurality of ferroelectric capacitors, each of which is connected in parallel with one of the cell transistors between a source and a drain of the one of the cell transistors; and a sense amplifier configured to detect data in one of the ferroelectric capacitors, wherein one of the cell transistors and one of the ferroelectric capacitors configure a memory cell, a plurality of the memory cells are connected in series in order to configure a plurality of memory cell blocks, the memory cell blocks respectively include the memory cells connected to the same word lines, first ends of the memory cell blocks are respectively connected to the bit lines via block selection transistors, second ends of the memory cell blocks are respectively connected to the plate lines, and connection positions between the memory cell blocks and the plate lines in an extension direction of the bit lines are different positions for each bit line.

10. The device of claim 9, wherein the plate lines are configured to extend in approximately parallel with a direction of the word lines.

* * * * *